(12) United States Patent
Wu

(10) Patent No.: US 8,823,050 B2
(45) Date of Patent: Sep. 2, 2014

(54) ORGANIC LIGHT-EMITTING DEVICE

(71) Applicant: AU Optronics Corporation, Hsin-Chu (TW)

(72) Inventor: Chang-Yen Wu, Hsin-Chu (TW)

(73) Assignee: AU Optronics Corporation, Hsin-Chu (TW)

( * ) Notice: Subject to any disclaimer, the term of this patent is extended or adjusted under 35 U.S.C. 154(b) by 0 days.

(21) Appl. No.: 13/872,392

(22) Filed: Apr. 29, 2013

(65) Prior Publication Data
US 2013/0320315 A1 Dec. 5, 2013

(30) Foreign Application Priority Data
May 30, 2012 (TW) .............................. 101119331 A

(51) Int. Cl.
*H01L 33/00* (2010.01)
*H01L 51/00* (2006.01)
*H01L 51/52* (2006.01)

(52) U.S. Cl.
CPC ..................................... *H01L 51/52* (2013.01)
USPC .............................. 257/102; 257/40; 257/103

(58) Field of Classification Search
CPC ............................ H01L 51/5024; H01L 51/52
USPC ........................................... 257/40, 102, 103
See application file for complete search history.

(56) References Cited

U.S. PATENT DOCUMENTS

2012/0121933 A1* 5/2012 Ma et al. ........................ 428/704
2012/0235127 A1* 9/2012 Takasu et al. .................... 257/40

FOREIGN PATENT DOCUMENTS

TW 201125165 7/2011

OTHER PUBLICATIONS

Ping-I Shih, "Blue and White Phosphorescent Organic Light-Emitting Diodes: Materials and Devices", Jun. 2005, Department of Applied Chemistry College of Science National Chiao-Tung University, Hsinchu, Taiwan.

* cited by examiner

*Primary Examiner* — Tu-Tu Ho
(74) *Attorney, Agent, or Firm* — WPAT, PC; Justin King

(57) ABSTRACT

An organic light-emitting device (OLED) is disclosed. The OLED includes a light-emitting layer, a first electrode, and a second electrode, in which the light-emitting layer is interposed between the first and the second electrodes and includes a first molecular energy level of a host, and a second molecular energy level of a dopant. The first molecular energy level has a highest occupied molecular orbital (HOMO) which is substantially same as the HOMO of the second molecular energy level, or the first molecular energy level has a lowest unoccupied molecular orbital (LUMO) which is substantially the same as the LUMO of the second molecular energy level.

7 Claims, 8 Drawing Sheets (A)

(B)

(A)

(B)

(A)

(B)

ORGANIC LIGHT-EMITTING DEVICE

RELATED APPLICATIONS

This application claims priority to Taiwan Application Serial Number 101119331, filed May 30, 2012, which is herein incorporated by reference.

BACKGROUND

1. Technical Field

The present disclosure relates to a light-emitting device, and more particularly, to an organic light-emitting device.

2. Description of Related Art

In recent years, many researches have been dedicated to electroluminescent device technology, in which an organic light-emitting device (e.g., a light-emitting diode) attracted even more attention. The so-called electroluminescence refers to energy in a form of light wave released by electrons dropping down to lower energy level from higher energy level (excited state).

The electroluminescent structure of the basic organic light-emitting device includes an organic light-emitting material interposed between two electrodes. First, holes and electrons are injected to a light-emitting layer by an anode (typically made of indium tin oxide (ITO) transparent electrode) and a cathode, respectively, and those holes and electrons then combine in the layer, which is made of the light-emitting material, to excite the light-emitting molecules to an excited state from a ground state. When those molecules come back to the ground state from the excited state, energy is released in a form of light; that is, electric energy is transformed into light wave. Briefly, there are electric currents flowing through the light-emitting layer, such that the electric energy enables the light wave from the light-emitting material. However, if the light-emitting layer were made of a single kind of material (100%), it would cause excitons quenching and thus severely decrease luminous efficiency. Currently, co-evaporation of both a host and a dopant (or a dye) is used to form the light-emitting layer in the OLED like a phosphorescent OLED.

Concerning the molecular energy level of the light-emitting layer of the phosphorescent light-emitting diode, when applying voltage, electrons in the reductive state molecules of the host material and holes in the oxidative state molecules thereof are separately injected to the host molecules having a energy difference (energy barrier) therebetween to form excitons and then transform energy to the dopant molecules. Sequentially, the dopant molecules in the excited state come back to the ground state to emit light. Therefore, the energy level (either singlet or triplet energy structure) of the phosphorescence host material must be higher than that of the phosphorescence dopant material, in which the energy barrier (HOMO-LUMO) of the singlet energy level of the phosphorescence host material is even greater. As to the OLED (such as a blue phosphorescent light-emitting diode) having higher energy barrier, even higher operating voltage is required to convert electric energy to light wave. Further, because the energy barrier of the singlet energy level of the blue phosphorescent host material is particularly large, such that the operating voltage of the blue phosphorescent OLED would be significantly greater than that for the components of other colors.

Therefore, in the conventional photoluminescence device, there is still a need to decrease operating voltage and improve luminous efficiency.

SUMMARY

An organic light-emitting device includes a light-emitting layer, a first electrode, and a second electrode, in which the light-emitting layer is interposed between the first and the second electrodes and includes a first molecular energy level of a host, and a second molecular energy level of a dopant. The first molecular energy level has a highest occupied molecular orbital (HOMO) which is substantially the same as the HOMO of the second molecular energy level, or the first molecular energy level has a lowest unoccupied molecular orbital (LUMO) which is substantially the same as the LUMO of the second molecular energy level.

BRIEF DESCRIPTION OF THE DRAWINGS

The disclosure may be more fully understood by reading the following detailed description of the embodiment, with reference made to the accompanying drawings as follows:

FIG. 5(A) is illustrating current density under different operating voltages according to one embodiment of the present disclosure.

DETAILED DESCRIPTION

Figure 1:
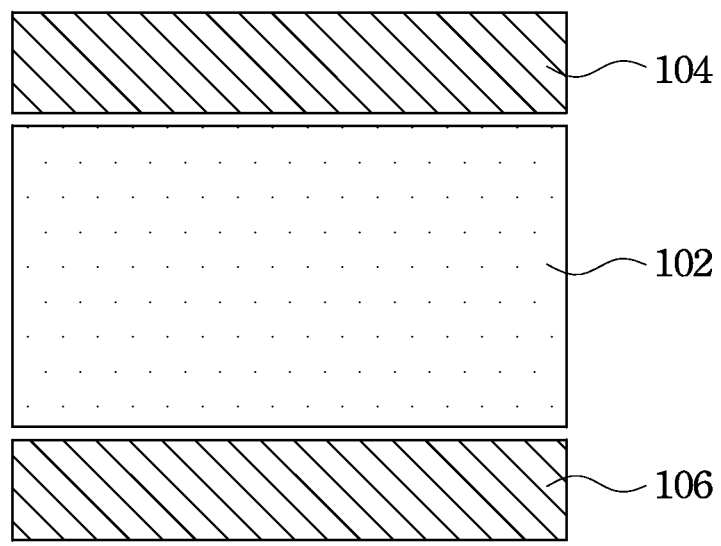
FIG. 1 is a schematic diagram of an organic light-emitting device according to one embodiment of the present disclosure.

The present disclosure is described by the following specific embodiments. Those with ordinary skill in the arts can readily understand the other advantages and functions of the present invention after reading the disclosure of this specification. The present disclosure can also be implemented with different embodiments. Various details described in this specification can be modified based on different viewpoints and applications without departing from the scope of the present disclosure.

As used herein, the singular forms "a," "an" and "the" include plural referents unless the context clearly dictates otherwise. Therefore, reference to, for example, a data sequence includes aspects having two or more such sequences, unless the context clearly indicates otherwise.

Reference will now be made in detail to the embodiments of the present disclosure, examples of which are illustrated in the accompanying drawings. Wherever possible, the same reference numbers are used in the drawings and the description to refer to the same or like parts.

According to one embodiment of the organic light-emitting device of the present disclosure, the inventive concept is to allow HOMOs or LUMOs of both a host and a dopant in a light-emitting layer are substantially the same. The term "substantially the same" refers to two comparing molecular energy levels are the same or the difference therebetween less than 0.3 eV (i.e., the difference is in a range of 0 to 0.3 eV).

According to the light-emitting layer of the organic light-emitting device of the embodiment of the present disclosure, the molecular energy level are used to allow more electrons or holes do not need to respectively inject to the LUMO and the HOMO of the host material (such as phosphorescent blue organic molecules) having high energy barrier. In other words, those carriers just need to inject to the dopant material having lower energy barrier to directly form excitons and emit light, and thus the operating voltage of the phosphorescent blue OLED can be decreased.

FIG. 1 is a schematic diagram of an organic light-emitting device according to one embodiment of the present disclosure.

As shown in FIG. 1, the organic light-emitting device 100 includes a top electrode (cathode) 104, a bottom electrode (anode) 106 and a light-emitting layer 102 disposed between the top electrode 104 and the bottom electrode 106.

In order to have good interfacial bonding property between the light-emitting layer and the top/bottom electrode, one or more buffer layers can be selectively disposed between those layers. The buffer layers can include but not be limited to injection layers of electrons and holes and transporting layers thereof. Therefore, according to one embodiment of the present disclosure, the organic light-emitting device includes an organic light-emitting diode (OLED) having multi-layer structure including a light-emitting layer (various color light-emitting layers can be separated), an electron injection layer, an electron transporting layer, a hole injection layer, and a hole transporting layer. The electron transporting layer is optionally disposed since the light-emitting layer also has the electron transporting property.

Figure 2:
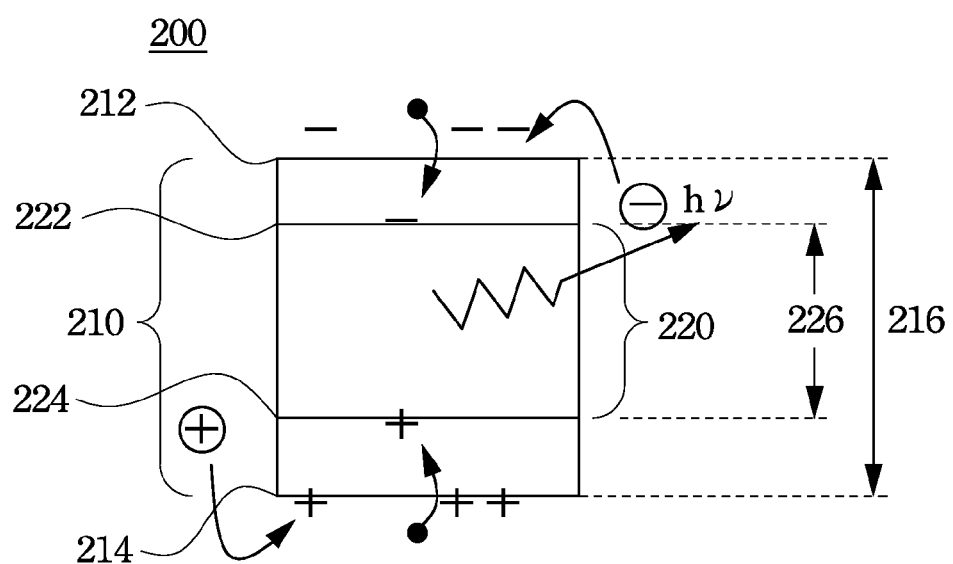
FIG. 2 (prior art) is a schematic diagram of a molecular energy level of a light-emitting layer.

FIG. 2 is a schematic diagram of a molecular energy level 200 of a light-emitting layer of a conventional OLED. The light-emitting layer of the conventional OLED includes a host 210 and a dopant 220. The host 210 has a highest occupied molecular orbital (HOMO) 214 and a lowest unoccupied molecular orbital (LUMO) 212, and a difference therebetween is defined as a molecular energy gap 216 of the host 210. The dopant 220 has a HOMO 224 and a LUMO 222, and a difference therebetween is defined as a molecular energy gap 226 of the dopant 220. As shown in FIG. 2, in the light-emitting layer of the conventional OLED, the two LUMOs and the two HOMOs of the dopant 220 and the host 210 respectively have an energy gap therebetween.

In the molecular energy level 200 of the light-emitting layer of the conventional OLED, electrons are needed to be activated to the host material which has a higher energy gap between the LUMO and the HOMO, and energy is then transferred to the dopant to form excitons and emit light (hv).

Figure 3:
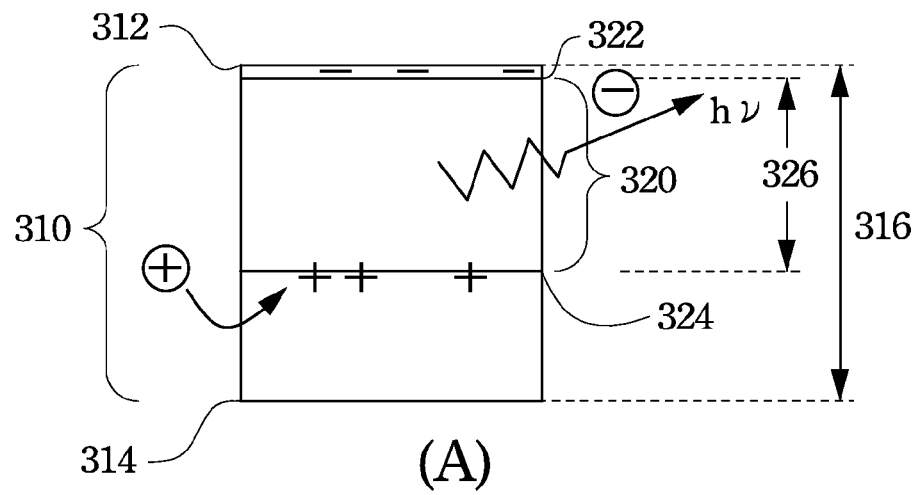
FIGS. 3(A) and 3(B) is a schematic diagram of a molecular energy level of a light-emitting layer in an organic light-emitting device according to another embodiment of the present disclosure.
Figure 3:
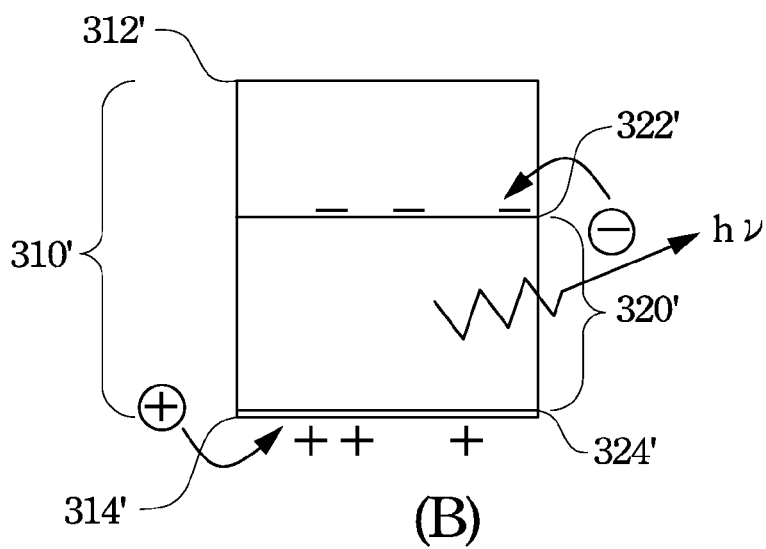

FIG. 3 is a schematic diagram of a molecular energy level 300 of a light-emitting layer in an organic light-emitting device according to one embodiment of the present disclosure. A host and a dopant, which exhibit different conductive types or different LUMO/HOMO values, can be coordinated to let the LUMO of the host be substantially the same as the LUMO of the dopant (as shown in FIG. 3(A)), or the HOMO of the host be substantially the same as the HOMO of the dopant (as shown in FIG. 3(B)).

Specifically, the molecular energy level 300 shown in FIG. 3(A) includes a HOMO 314 and a LUMO 312 of a host 310, which has a molecular energy gap 316 defined by the HOMO 314 and the LUMO 312, and a HOMO 324 and a LUMO 322 of a dopant 320, which has a molecular energy gap 326 defined by the HOMO 324 and the LUMO 322. Because the LUMO 322 of the dopant 320 is substantially the same as the LUMO 312 of the host 310, electrons/holes are directly injected to the dopant material having lower energy gap to form excitons and emit light (hv). The molecular energy level of the light-emitting layer is generally formed from n-type host material and p-type dopant material.

As shown in FIG. 3(B), the molecular energy level 300' includes a HOMO 314' and a LUMO 312' of a host 310', which has a molecular energy gap 316' defined by the HOMO 314' and the LUMO 312', and HOMO 324' and a LUMO 322' of a dopant 320', which has a molecular energy gap 326' defined by the HOMO 324' and the LUMO 322'. Because the HOMO 324' of the dopant 320' is substantially the same as the HOMO 314' of the host 310', electrons/holes are directly injected to the dopant having lower energy gap to form excitons and emit light (hv). The molecular energy level of the light-emitting layer is generally formed from p-type host material and n-type dopant material.

Figure 4:
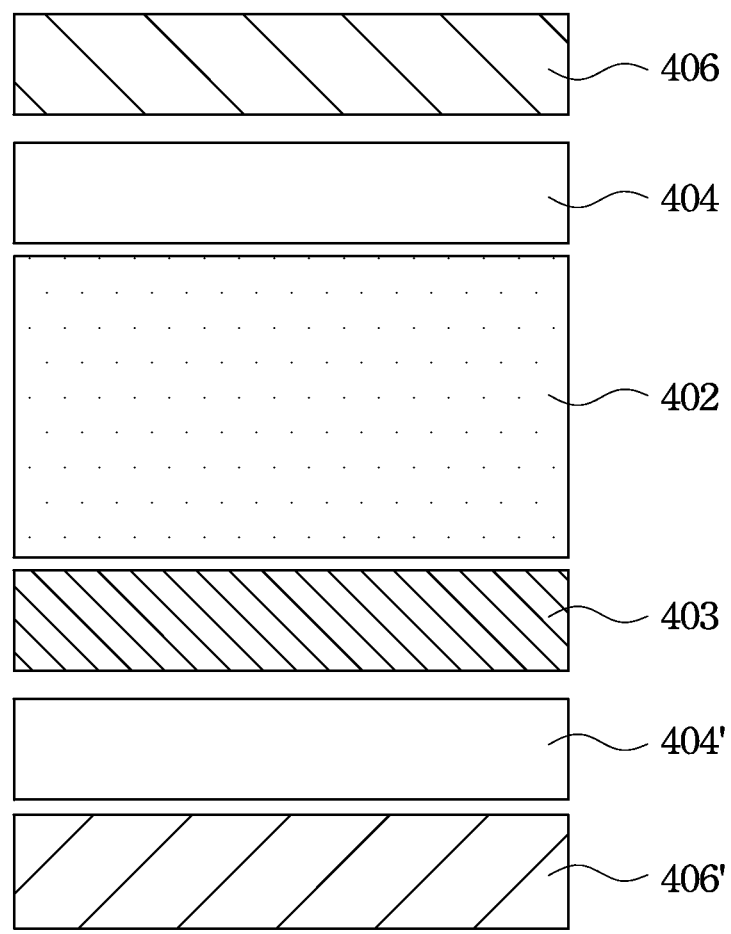
FIG. 4 is a scheme diagram of an organic light-emitting device according to Example 1 of the present disclosure.

FIG. 4 is a scheme diagram of an OLED device 400 according to Example 1 of the present disclosure. In the OLED device 400, a blue light-emitting layer 402 and a red-green light-emitting layer 403 are interposed between a top electrode (cathode) 406 and a bottom electrode (anode, ITO transparent electrode) 406'. Further, a electron transporting layer 404 is disposed between the blue light-emitting layer 402 and the cathode 406, and a hole transporting layer 404' is disposed between the red-green light-emitting layer 403 and the anode 406'.

Figure 5:
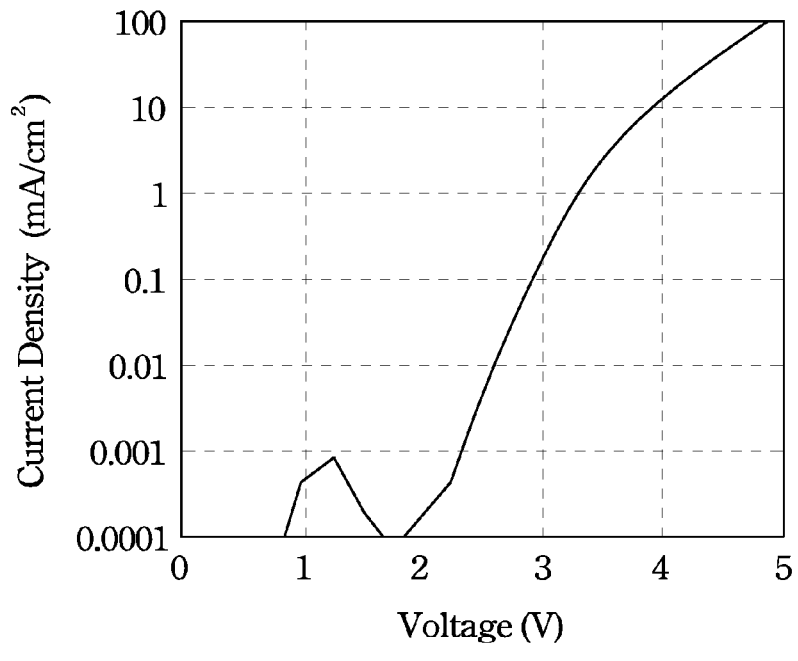
FIG. 5 (B) is illustrating threshold value of needed operating voltage while turning on a organic light-emitting device according to the embodiment.
Figure 5:
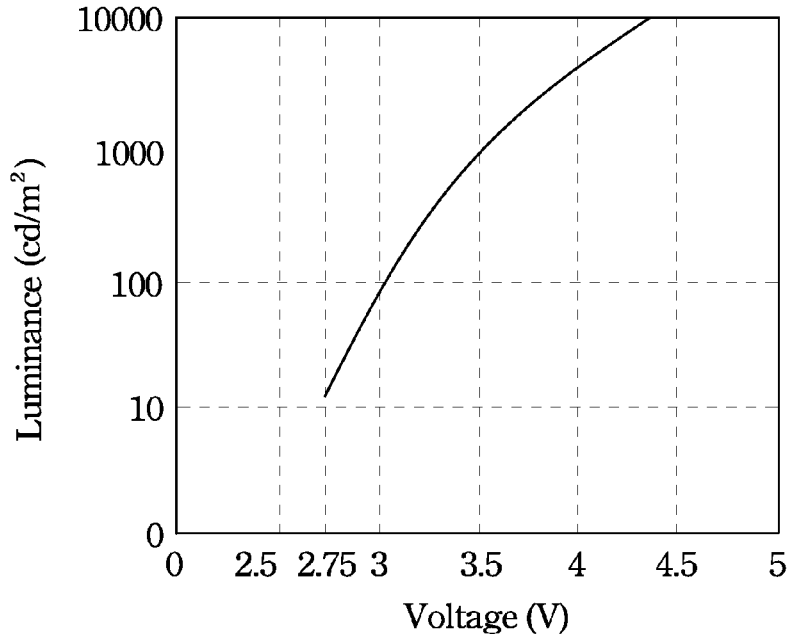

According to Example 1, the blue light-emitting layer 402 is composed of 80% H93 as n-type host material and 20% BD176 as p-type dopant material. The HOMO and the LUMO of H93 respectively are 5.8 eV and 2.4 eV, and the energy gap is 3.4 eV. The HOMO and the LUMO of BD176 respectively are 5.1 eV and 2.4 eV, and the energy gap is 2.7 eV. FIG. 5(A) is illustrating current density under different operating voltages according to the embodiment of the present disclosure; FIG. 5(B) is illustrating threshold value of needed operating voltage while turning on the OLED device and luminance of the OLED device according to the embodiment. As shown in FIG. 5(B), the operating voltage for turning on the OLED device of the embodiment is only 2.75 eV, which is close to the theoretical value of the energy gap (2.7 eV) between the HOMO and the LUMO of the dopant material, and far lower than 3.4 eV for which electrons/holes are first injected to the host material. Because the LUMO of H93 (n-type host material) is the same as the LUMO of BD176 (p-type dopant material), electrons and holes are directly injected to the LUMO of H93 and the HOMO of BD176 separately to decrease energy barrier of carriers' injection and further decrease the operating voltage.

Figure 6:
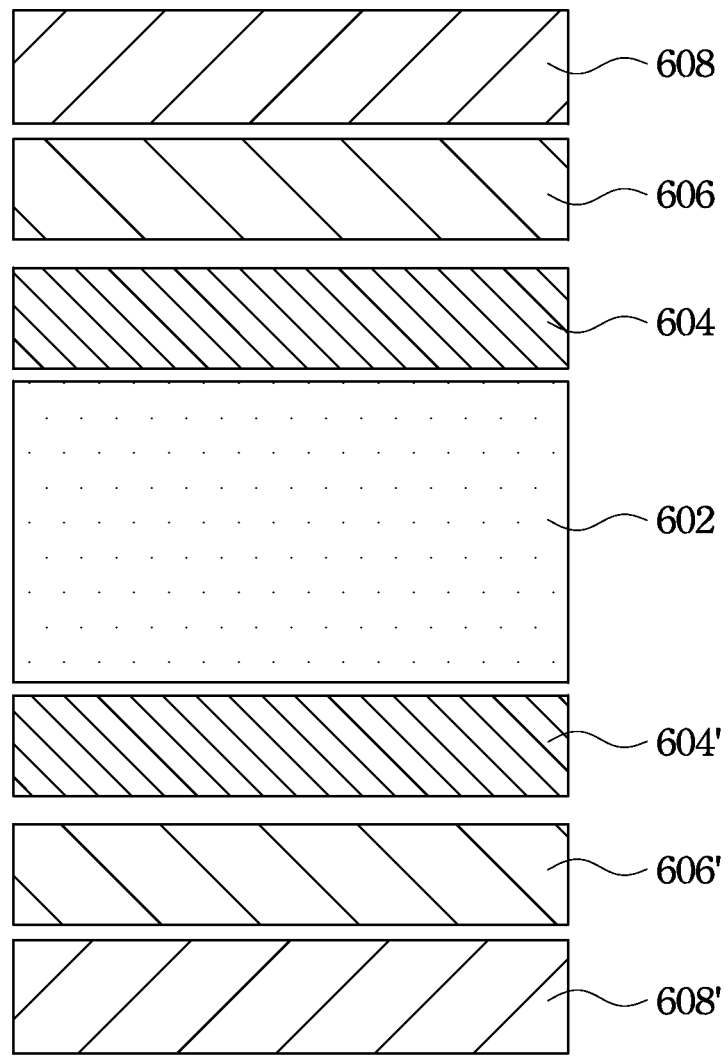
FIG. 6 is a scheme diagram of an organic light-emitting device according to Example 2 of the present disclosure.

FIG. 6 is a scheme diagram of Example 2 and a phosphorescent blue OLED device 600 of Comparative Example 1. In the phosphorescent blue OLED device 600, a blue light-emitting layer 602 is interposed between a top electrode (cathode) 608 and a bottom electrode (anode) 608'. Further, a electron transporting layer 604 and a electron injection layer 606 are disposed between the blue light-emitting layer 602 and the cathode 608, and a hole transporting layer 604' and a hole injection layer 606' are disposed between the blue light-emitting layer 602 and the anode 608'.

The materials of the blue light-emitting layers in Example 2 and Comparative Example 1 are listed in Table 1.

TABLE 1

| Light-emitting layer | Host material | Dopant material |
|---|---|---|
| Example 2 | H93 (80%) | BD176 (20%) |
| Comparative Example 1 | 39TCz (80%) | BD176 (20%) |

In Comparative Example 1, the blue light-emitting layer is composed of 80% 39TCz (3,6-bis(carbazol-9-yl)-9-(2-ethyl-hexyl)-9H-carbazole) as host material and 20% BD176 as p-type dopant material. The HOMO and the LUMO of 39TCz respectively are 5.5 eV and 2.23 eV, and the energy gap is 3.27 eV. The HOMO and the LUMO of BD176 respectively are 5.1 eV and 2.4 eV, and the energy gap is 2.7 eV. The energy gap between the LUMO of 39TCz (host material) and the LUMO of BD176 (p-type dopant material) is lower than 0.3 eV. It is because 39TCz belongs to partial p-type material, which exhibits poor electron transporting ability. Therefore, in Comparative Example 1, electrons and holes are not easily injected to the LUMO of 39TCz and the HOMO of BD176 separately, and thus cannot reduce the energy barrier of carriers' injection and the operating voltage.

Figure 7:
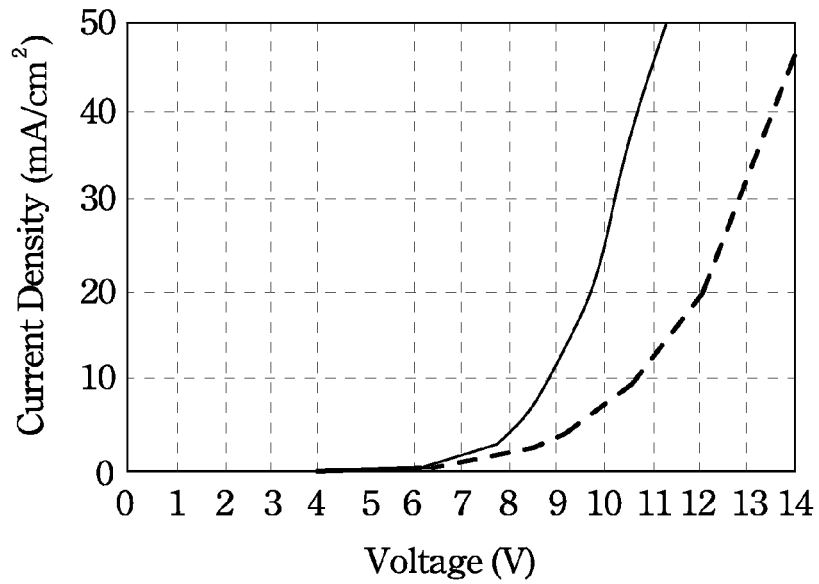
FIGS. 7(A) and 7(B) are respectively illustrating current density and luminance of Example 2 and Comparative Example 1.
Figure 7:
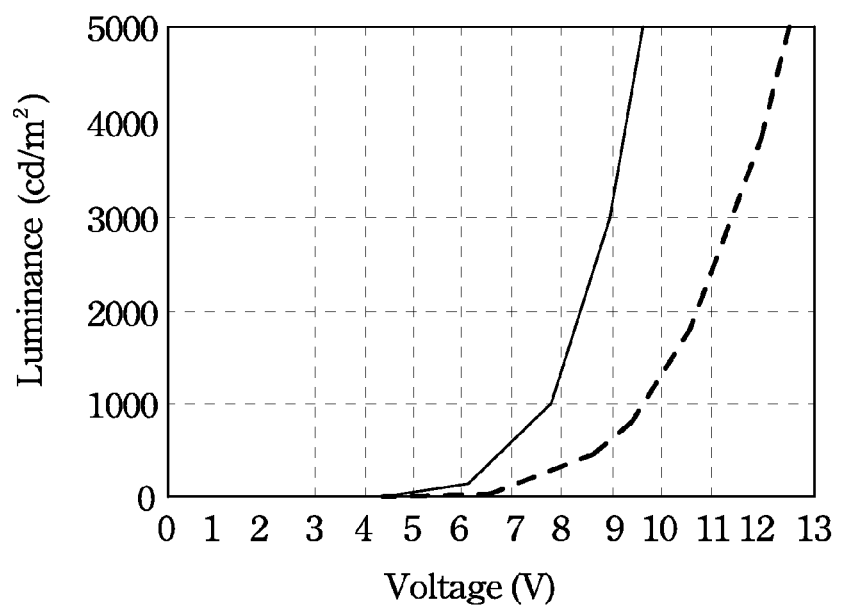

FIGS. 7(A) and 7(B) are respectively illustrating current density and luminance of Example 2 and Comparative Example 1. As shown in FIGS. 7(A) and 7(B), the left curve (solid line) presents measured values according to Example 2, and the right curve (dotted line) presents measured values according to Comparative Example 1. Figure clearly shows that luminance and current density of the phosphorescent blue OLED of Example 2 are much higher than those of Comparative Example 1 under the same operating voltage.

Figure 8:
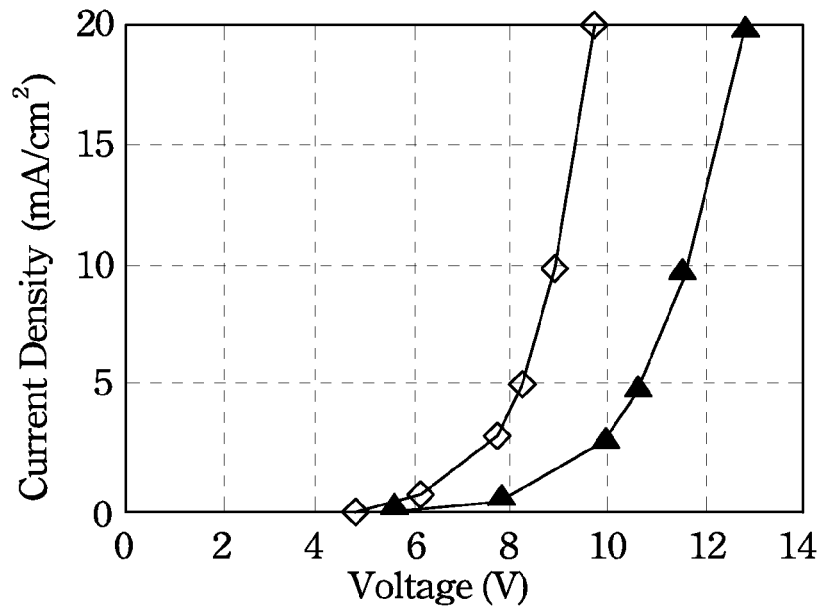
FIGS. 8(A) and 8(B) are respectively illustrating current density and luminance of Example 1 and Comparative Example 2.
Figure 8:
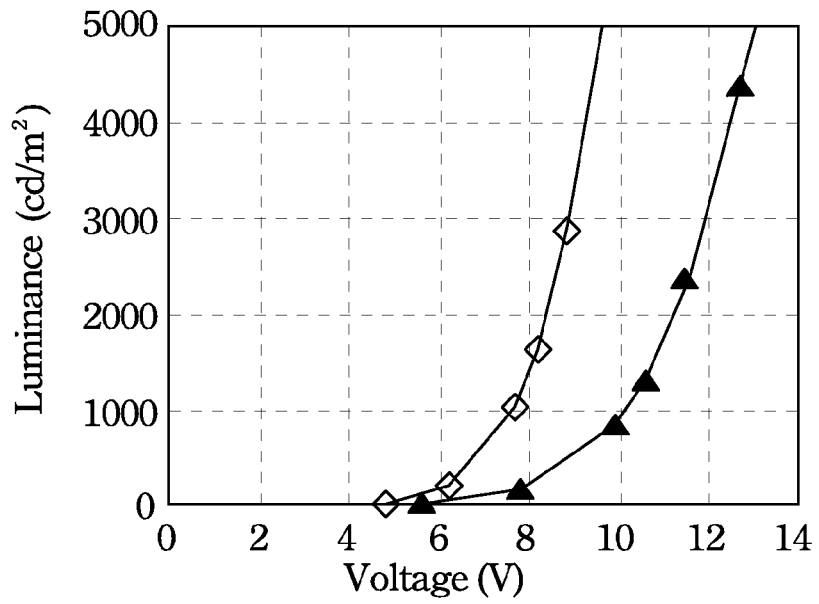

FIG. 8 is illustrating luminance of Example 1 and Comparative Example 2. The structure of Comparative Example 2 is the same as the structure of the OLED device 400 of Example 1.

TABLE 2

| Light-emitting layer | Host material | Dopant material |
|---|---|---|
| Example 1 | H93 (80%) | BD176 (20%) |
| Comparative Example 2 | TFTPA (80%) | BD176 (20%) |

In Comparative Example 2, the blue light-emitting layer is composed of 80% TFTPA (fluorene-triphenylamine tris[4-(9-phenylfluoren-9-ylphenyamine) as host material and 20% BD176 as dopant material. The HOMO and the LUMO of TFTPA respectively are 5.57 eV and 2.1 eV, and the energy gap is 3.37 eV. The HOMO and the LUMO of BD176 respectively are 5.1 eV and 2.4 eV, and the energy gap is 2.7 eV. The energy gap between the LUMO of TFTPA (host material) and the LUMO of BD176 (dopant material) is 0.3 eV. In Comparative Example 2, the energy gap (energy barrier) between the LUMOs of the host and the dopant is larger, and thus electrons of the electron transporting layer are not easily injected to the LUMO of TFTPA, and the operating voltage cannot be decreased. If electrons and holes are respectively injected to the LUMO of the host and the HOMO of the dopant, the energy barrier is 3.0 eV (5.1 eV-2.1 eV), which is significantly higher than the theoretical value of the energy gap (2.7 eV) between the HOMO and the LUMO of the dopant of Example 1.

As shown in FIGS. 8(A) and 8(B), the right curve (▲) presents measured values according to Comparative Example 2, and the left curve (◇) presents measured values according to Example 1. Similar to FIGS. 7(A) and 7(B), luminance and current density of the phosphorescent blue OLED of Example 1 are much higher than those of Comparative Example 2 under the same operating voltage.

The host material and the dopant material of the examples and the comparative examples of the present disclosure are commercial products purchased from Universal Display Corporation (UDC) at USA, in which such compound names (ex. H93 and BD176) are the permanent product names referring to the specific organic compounds and organometallic compounds.

Although the present disclosure has been described in considerable detail with reference to certain embodiments thereof, other embodiments are possible. Therefore, the spirit and scope of the appended claims should not be limited to the description of the embodiments contained herein.

It will be apparent to those ordinarily skilled in the art that various modifications and variations may be made to the structure of the present disclosure without departing from the scope or spirit of the disclosure. In view of the foregoing, it is intended that the present disclosure cover modifications and variations thereof provided they fall within the scope of the following claims.

What is claimed is:

1. An organic light-emitting device, comprising:
   a light-emitting layer, comprising:
      a host having a first molecular energy level and made of n-type phosphorescence material; and
      a dopant having a second molecular energy level and made of p-type phosphorescence material, wherein the first molecular energy level has a highest occupied molecular orbital (HOMO) which is substantially the same as the HOMO of the second molecular energy level, or the first molecular energy level has a lowest unoccupied molecular orbital (LUMO) which is substantially the same as the LUMO of the second molecular energy level;
   a top electrode; and
   a bottom electrode, wherein the light-emitting layer is interposed between the top electrode and the bottom electrode.

2. The organic light-emitting device of claim 1, wherein the host and the dopant are made of phosphorescence materials.

3. The organic light-emitting device of claim 1, wherein the LUMO of the first molecular energy level of the host and the LUMO of the second molecular energy level of the dopant are the same, or the difference between the LUMO of the first molecular energy level of the host and the LUMO of the second molecular energy level of the dopant is less than 0.3 eV.

4. The organic light-emitting device of claim 1, further comprising a transporting layer, an injection layer, or a transporting layer and an injection layer disposed between the light-emitting layer and the top electrode or between the light-emitting layer and the bottom electrode.

5. The organic light-emitting device of claim 4, wherein the transporting layer is an electron transporting layer or a hole transporting layer, and the injection layer is an electron injection layer or a hole injection layer.

6. An organic light-emitting device, comprising:
   a light-emitting layer, comprising:
      a host having a first molecular energy level and made of p-type phosphorescence material; and
      a dopant having a second molecular energy level and made of n-type phosphorescence material, wherein the first molecular energy level has a highest occupied molecular orbital (HOMO) which is substantially the same as the HOMO of the second molecular energy level, or the first molecular energy level has a lowest unoccupied molecular orbital (LUMO) which is substantially the same as the LUMO of the second molecular energy level;
a top electrode; and
a bottom electrode, wherein the light-emitting layer is interposed between the top electrode and the bottom electrode.

7. The organic light-emitting device of claim 6, wherein the HOMO of the first molecular energy level of the host and the HOMO of the second molecular energy level of the dopant are the same, or the difference between the HOMO of the first molecular energy level of the host and the HOMO of the second molecular energy level of the dopant is less than 0.3 eV.

* * * * *